United States Patent
Chen et al.

(10) Patent No.: US 11,860,383 B2
(45) Date of Patent: Jan. 2, 2024

(54) FLARE-SUPPRESSING IMAGE SENSOR

(71) Applicant: OmniVision Technologies, Inc., Santa Clara, CA (US)

(72) Inventors: Gang Chen, San Jose, CA (US); Qin Wang, San Jose, CA (US); Chao Niu, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/392,023

(22) Filed: Aug. 2, 2021

(65) Prior Publication Data

US 2023/0035130 A1    Feb. 2, 2023

(51) Int. Cl.
*H04N 25/61*  (2023.01)
*G02B 3/00*  (2006.01)
*H04N 25/70*  (2023.01)

(52) U.S. Cl.
CPC ........... *G02B 3/0043* (2013.01); *H04N 25/61* (2023.01); *H04N 25/70* (2023.01)

(58) Field of Classification Search
CPC ..... G02B 3/0043; H04N 5/3572; H04N 5/369
See application file for complete search history.

(56) References Cited

U.S. PATENT DOCUMENTS

| | | | |
|---|---|---|---|
| 2008/0180648 A1* | 7/2008 | Mei ...................... | G03F 7/70291 355/67 |
| 2013/0141634 A1* | 6/2013 | Korenaga .............. | H04N 23/75 348/360 |
| 2016/0091786 A1* | 3/2016 | Kazmierski ....... | G02F 1/133526 353/30 |
| 2017/0026592 A1* | 1/2017 | Kuang ................. | H04N 5/3572 |
| 2017/0179180 A1* | 6/2017 | Kim .................. | H01L 27/14685 |
| 2018/0227550 A1* | 8/2018 | Fossum ............. | H01L 27/14621 |
| 2020/0029035 A1* | 1/2020 | Agranov .............. | H04N 5/3572 |
| 2021/0143200 A1* | 5/2021 | Cho .................. | H01L 27/14683 |

* cited by examiner

*Primary Examiner* — Mekonnen D Dagnew
(74) *Attorney, Agent, or Firm* — COZEN O'CONNOR

(57) ABSTRACT

Embodiments disclosed herein reduce petal flare. A flare-suppressing image sensor includes a plurality of pixels including a first set of pixels and a second set of pixels. The flare-suppressing image sensor further includes plurality of microlenses, where each microlens is aligned to a respective one of the first set of pixels. The flare-suppressing image sensor further includes plurality of sub-microlens, where each microlens array is aligned to a respective one of the second set of pixels.

16 Claims, 3 Drawing Sheets

FLARE-SUPPRESSING IMAGE SENSOR

BACKGROUND

Camera modules in commercial products such as stand-alone digital cameras, mobile devices, automotive components, and medical devices include an image sensor having a pixel array. The pixel array includes a plurality of pixels arranged as a two-dimensional periodic array. Many image sensors include a microlens array, formed of a plurality of microlenses each aligned to a respective pixel. The periodicity of the image sensor's pixel array and microlens array thereon result in the image sensor resembling a reflective two-dimensional diffraction grating. Part of light incident on the image sensor is diffracted toward the camera's imaging lens. Different elements of the camera, e.g., a cover glass, an IR-cut filter, a surface of the imaging lens, reflect this diffracted light back toward the image sensor, which produces an image artifact known as petal flare.

SUMMARY OF THE EMBODIMENTS

Embodiments disclosed herein reduce petal flare. A flare-suppressing image sensor includes a plurality of pixels including a first set of pixels and a second set of pixels. The flare-suppressing image sensor further includes a plurality of microlenses, where each microlens is aligned to a respective one of the first set of pixels. The flare-suppressing image sensor further includes a plurality of sub-microlens arrays, where each sub-microlens array is aligned to a respective one of the second set of pixels.

DETAILED DESCRIPTION OF THE EMBODIMENTS

Petal flare occurs when light scatters from one lens within an image sensor onto another, distorting an image. For example, when light reflects, diffracts, or is incident upon a lens, the light may interfere with nearby lenses. One aspect of the present embodiments includes the realization that a primary source of petal flare is light incident on, and focused, by a lens or microlens of an adjacent pixel. Embodiments of the present disclosure reduce petal flare by arranging pixels to align with alternating microlenses and sub-microlenses. The present embodiments reduce petal flare by including multiple sub-microlenses (a sub-microlens array) aligned with alternating pixels, where each sub-microlens transmits a portion of light incident on the refractive element of each sub-microlens. In some embodiments, rather than having alternating pixels aligned with microlens and a sub-microlens array, the arrangements of pixels may be another periodic pattern or random to sufficiently reduce petal-flare buildup within an image sensor.

A microlens may be a lens with a width ranging between ten micrometers and a millimeter and a sub-microlens may be a lens with a width ranging between a half micrometer to three micrometers.

Figure 1:
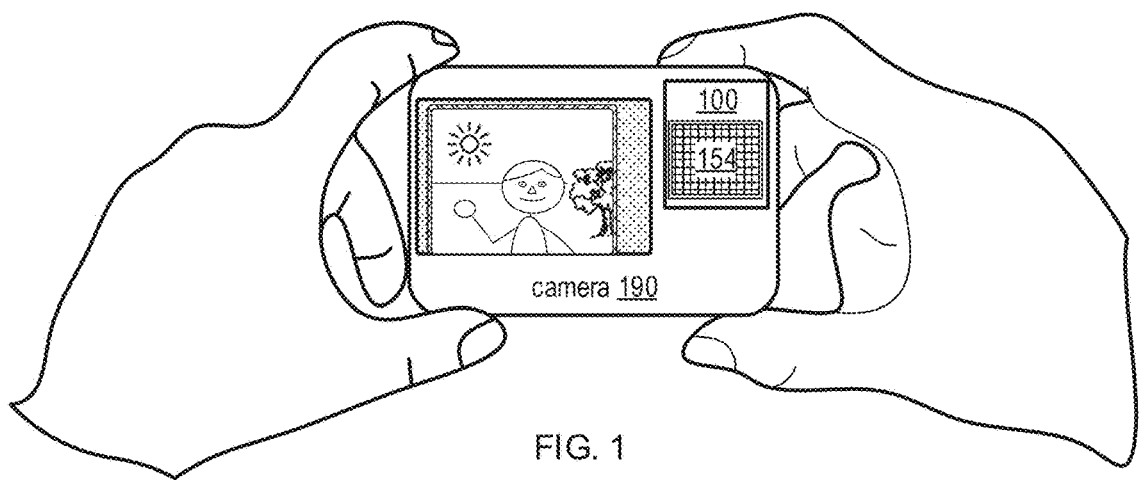
FIG. 1 depicts a camera imaging a scene, according to an embodiment.

FIG. 1 shows an image sensor 100, which includes a pixel array 154. In the scenario depicted in FIG. 1, image sensor 100 is incorporated in a camera 190 imaging a scene. Camera 190 includes an image sensor 100, which includes a pixel array 154. Image sensor 100 may be part of a chip-scale package or a chip-on-board package.

Figure 2:
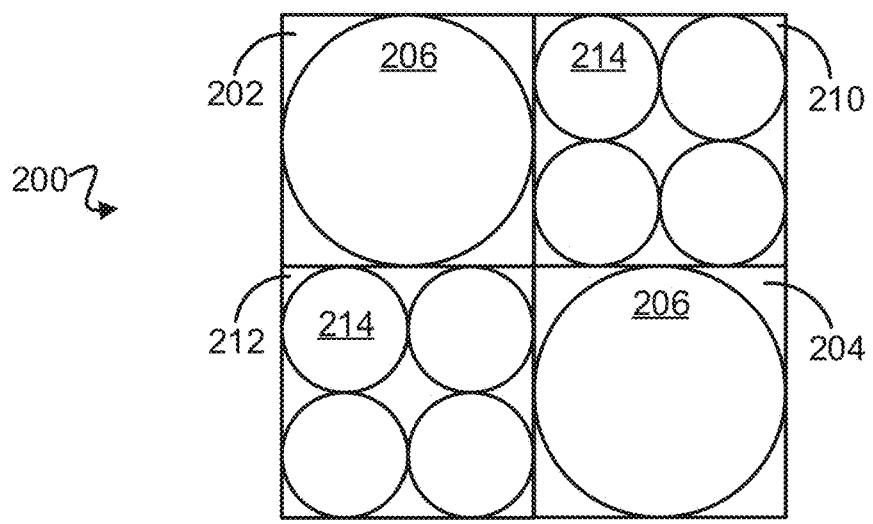
FIGS. 2 and 3 are schematics of a pixel array of a flare-suppressing image sensor, which are embodiments of the image sensor of FIG. 1.

FIG. 2 is a schematic of a pixel array 200 (e.g., a portion of the pixel array 154, FIG. 1) of a flare-suppressing image sensor (e.g., the image sensor 100). The pixel array 200 illustrated in FIG. 2 includes pixels 202, 204, each aligned with a microlens 206 and pixels 210, 212, each aligned with a sub-microlens 214 array. The sub-microlens 214 may have roughly half (e.g., between 40% and 60%) the width and half the radius of curvature (e.g., between 40% and 60%) as the microlens 206. Further, the sub-microlenses 214 are arranged in a 2×2 array within a surface area of pixels 210, 212. However, in some embodiments, the array of sub-microlenses 214 may be an N×N array, where N is any integer greater than 1. For example, the N×N array of microlenses may be a 3×3 array, 4×4 array, or any integer N that sufficiently reduces petal-flare buildup.

Figure 3:
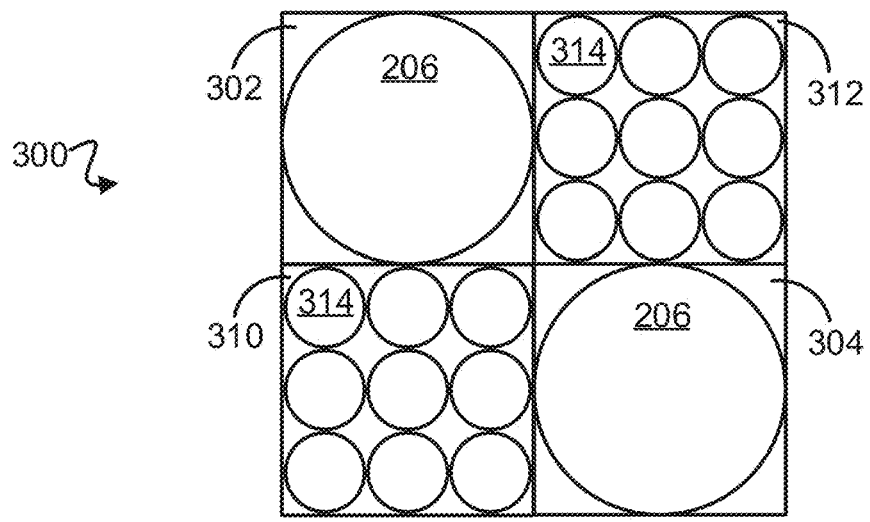

For example, FIG. 3 is a schematic of a pixel array 300 (e.g., a portion of the pixel array 154) of a flare-suppressing image sensor (e.g., image sensor 100). FIG. 3 includes pixels 302, 304, each aligned with microlens 206 and pixels 310, 312, each aligned with sub-microlens 314. The sub-microlens 314 are arranged in a 3×3 array. Each sub-microlens 314 may have roughly a third (e.g., between 20% and 45%) the width and radius of curvature of the microlens 206. The height, radius, and geometry of the sub-microlens 314 may vary to sufficiently reduce petal-flare buildup and is not limited by embodiments of the present disclosure.

Pixel arrays 200 and 300 may be organized into columns and rows, and each row may include both a first set of pixels that are aligned with a microlens and a second set of pixels that are aligned with an N×N array of sub-microlenses. The arrangement of the first set and second set of pixels within a row may be periodic or random. For example, the arrangement alternates between a pixel from (i) the first set of pixels and (ii) an adjacent pixel from the second set of pixels. The arrangement may be that two pixels from the first set of pixels are followed by two pixels from the second set of pixels. And/or the arrangement may include one pixel from the first set of pixels followed by two pixels from the second set of pixels. In general, the arrangement of the first set and second set of pixels may be periodic or random.

Figure 4:
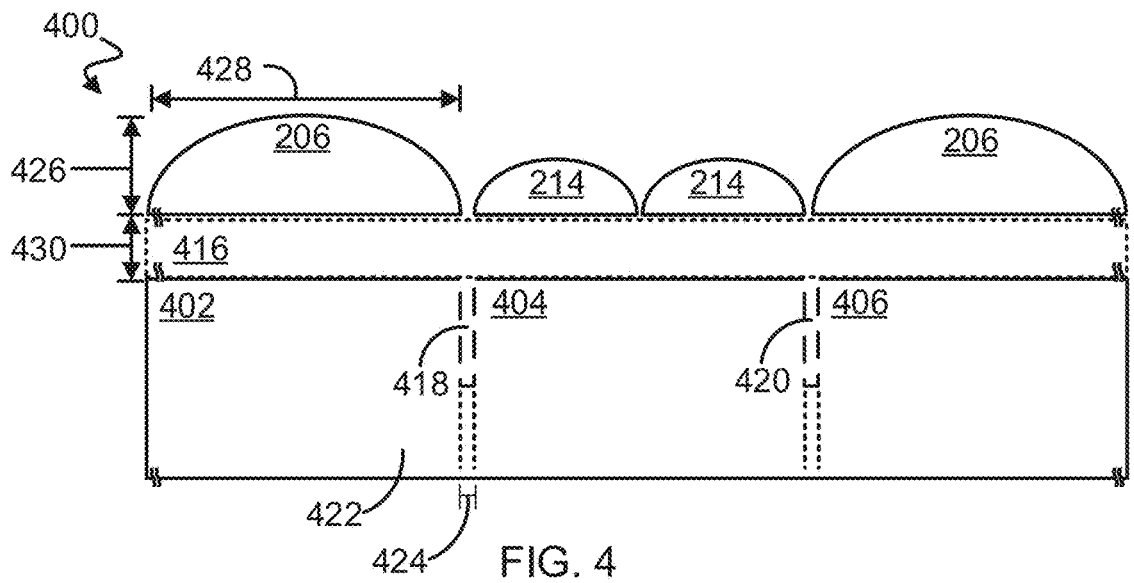
FIGS. 4-6 show a side view of a sequence of pixels that align with either a microlens or a sub-microlens array, according to an embodiment.
Figure 5:
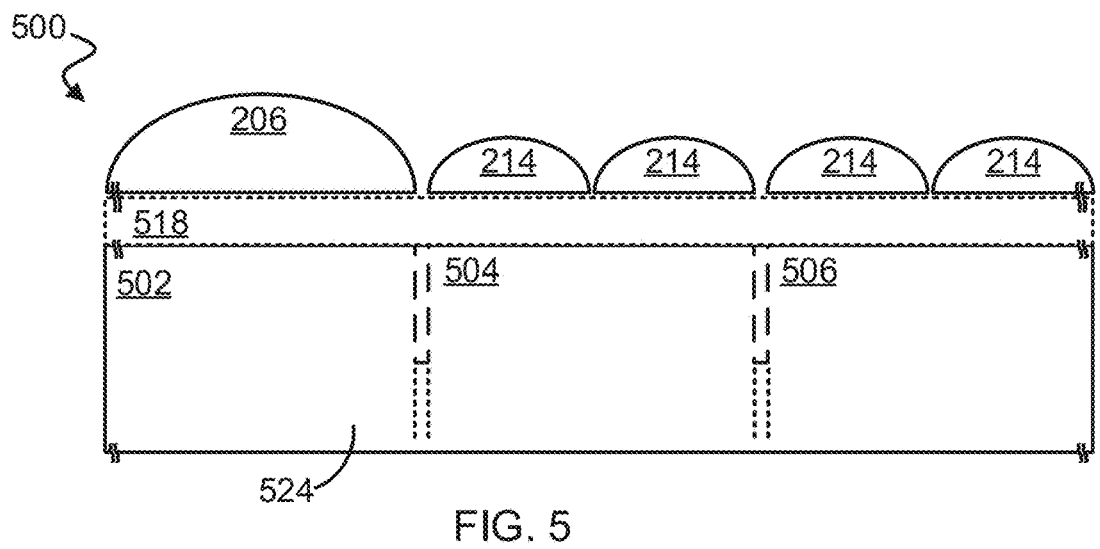
Figure 6:
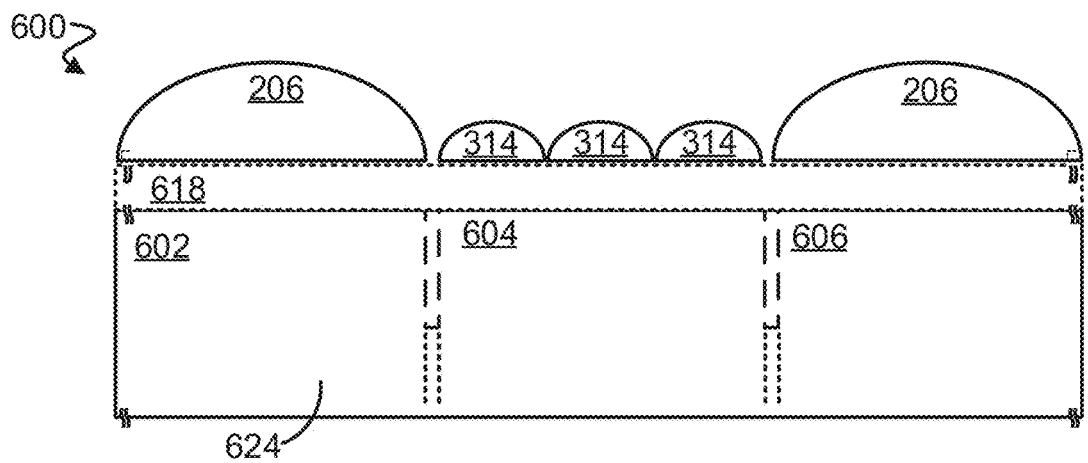

FIGS. 4-6 each show part of an image sensor (e.g., image sensor 100) that includes three pixels and show a different permutation of an arrangement of the first set and second set of pixels or different N×N arrays of sub-microlenses within a pixel. FIG. 4 is a schematic of part of an image sensor 400 that includes three pixels 402, 404, 406, where pixels 402, 406 are aligned with microlens 206 and pixel 404 is aligned with sub-microlens 214. The image sensor 400 may include one or more layers, examples of which include a spectral filter array, a passivation layer, and an oxide layer.

Image sensor 400 includes deep-trench isolation layers 418, 420 between adjacent pixels, that may vary in depth within a semiconductor substrate 422. In embodiments, deep-trench isolation layers 418, 420 includes an oxide. Deep-trench isolation layers 418, 420 have a width 424, which may be at least 150 nm such that light incident on deep-trench isolation layers 418, 420 experiences total-internal reflection and is not transmitted to an adjacent pixel. Semiconductor substrate 422 has a top surface 416.

Microlens 206 may be an oxide and fabricated utilizing chemical vapor deposition. In embodiments, microlens 206 is formed of a material, such as a glass, having a transition temperature between 140° C. and 180° C., such that it can withstand temperatures of a reflow process associated with an image sensor (e.g., image sensor 100). In some embodiments, the sub-microlens 214 comprises a substantially similar or the same material as the microlens 206. In some embodiments, the sub-microlens 214 comprises a different material than the microlens 206.

Each sub-microlens 214 may have a height peak that is determined such that each sub-microlens 214 has a back focal length equal to the thickness 430 of the top surface 416. In some embodiments, the height 426 of the microlens 206 is twice that of the height of the sub-microlens 214. In some embodiments, the proportion of the height 426 of microlens 206 to the height of the sub-microlens 214 is a value that sufficiently reduces petal-flare buildup. For example, the height of the sub-microlens 214 is between 30% and 70% that of the height 426 of the microlens 206. Similarly, the proportion of a width 428 of the base of the microlens 206 to the width of the base of the sub-microlens 214 may be a value that sufficiently reduces petal-flare buildup. In embodiments, width 428 and the width of lens 214 may be a maximum width along a same direction. In some embodiments, width 428 is roughly twice that of the width of the base of the sub-microlens 214. For example, width of the sub-microlens 214 is between 30% and 70% of the width 428. In embodiments, width 428 is between five micrometers and one millimeter, and the width of sub-microlens 214 is between a half micrometer and three micrometers.

FIGS. 5 and 6 are schematics of portions of image sensors 500 and 600, each of which includes three pixels and are variants of the image sensor 400. Image sensors 500 and 600 may include one or more layers, examples of which include a spectral filter array, a passivation layer, and an oxide layer. Pixels 502, 602, and 606 are aligned with microlens 206 and pixels 504, 506, and 604 are aligned with sub-microlenses 214, 314, respectively. Semiconductor substrates 524, 624 have a top surface 518, 618, respectively. FIGS. 5 and 6 are best viewed together in the following description.

Image sensors 500, 600 differ from image sensor 400 at least with respect to the periodic arrangement of types of microlenses and sub-microlenses aligned with pixels 502-506, 602-606. For example, image sensor 500 includes a different sequence of microlens 206 and sub-microlens 214. As can be seen, rather than microlens 206 being adjacent to sub-microlens 214, as in image sensor 400, image sensor 500 has the following sequence: pixel 502 aligned with microlens 206 followed by two pixels 504, 506 aligned with sub-microlens 214. This sequence may continue for each row of pixels of an image sensor pixel array. Moreover, each row (not shown) may have a shift in the pixel sequence with respect to an adjacent row within the pixel array. For example, a first row of pixels may begin with the sequence of image sensor 500: pixel 502 aligned with microlens 206 followed by two pixels 504, 506 aligned with sub-microlenses 214, as shown in FIG. 5. The second row (not shown) may begin with a pixel (e.g., pixel 504) aligned with sub-microlens 214, followed by a pixel (e.g., pixel 506) aligned with sub-microlens 214 and then followed by a pixel (e.g., pixel 502) aligned with microlens 206. And the third row may continue such that the image sensor 500 of pixels shown in FIG. 5 is shifted by one pixel to the right for each subsequent row. Or, alternatively, the second row may begin with a pixel aligned with sub-microlens 214, followed by a pixel aligned with microlens 206, and the sequence of pixels shown in FIG. 5 may continue. In embodiments, any permutation (periodic or random) of a sequence of pixels that is aligned with a respective microlens or sub-microlens is considered such that the permutation sufficiently reduces petal-flare buildup.

Similarly, image sensor 600 shows a sequence of pixels similar to that of image sensor 400, that is pixels aligned with microlens 206 are adjacent to pixels aligned with sub-microlens 314; however, the sub-microlens 314 are in a 3×3 array. Similar to the available permutations as in FIGS. 4, 5, the available permutations that are considered within this disclosure are such that the permutation sufficiently reduces petal-flare buildup. For example, a first row may include the row shown in FIG. 6 and a second row of pixels of image sensor 600 may begin with a pixel aligned with sub-microlens 314 followed by a pixel aligned with microlens 206, etc. Embodiments of the present disclosure are not limited to FIGS. 4-6 and may include any permutation and any N×N array of sub-microlens where N is any integer greater than 1. For example, a row of pixels may include a sequence of pixels as shown in FIG. 5 but each pixel aligned with a sub-microlens 214 may have a 3×3, 4×4, 5×5, etc. array. In some embodiments, any 9×9 array of pixels aligned with a microlens 206, sub-microlens 214, 314, etc. may include any combination of the image sensors 400, 500, 600. For example, the 9×9 array of sensor elements can include one of each of image sensors 400, 500, 600, two of image sensors 400, 500, 600, one of the image sensors may be rotated such that a row of pixels within the image sensor may become a column, etc.

Figure 7:
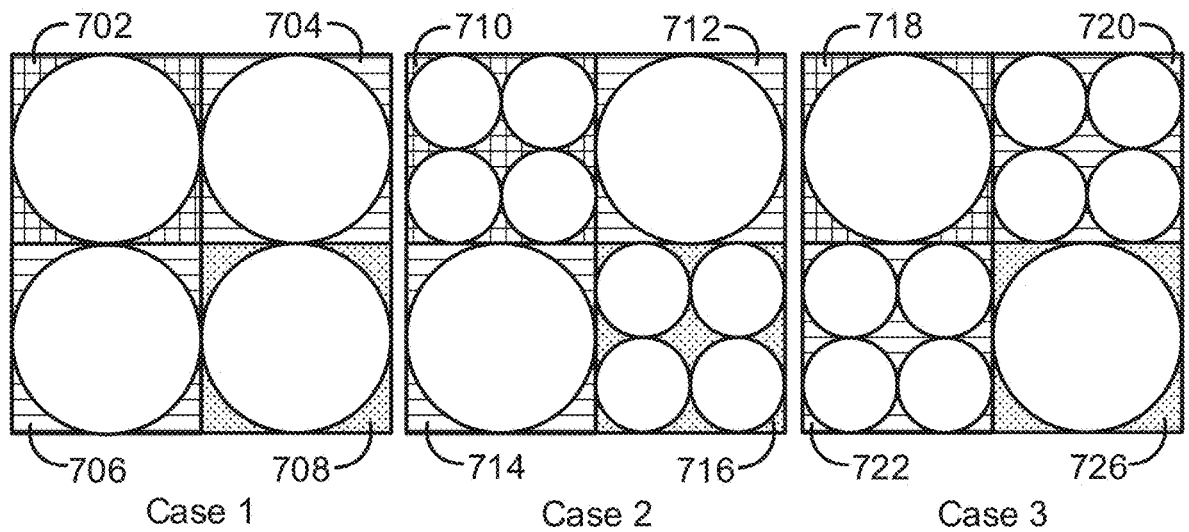
FIG. 7 shows three cases of an array of pixels that align with either microlens or sub-microlens array.

FIG. 7 shows cases 1-3, each depicted as a 2×2 array of pixels, aligned with a corresponding microlens (e.g., microlens 206) or sub-microlens (e.g., sub-microlens 214). In some embodiments, a Bayer filter may be used and each pixel may be one of a green, red, or blue color filter. For example, case 1 shows a 2×2 array of pixels, each pixel aligned with a microlens. Case 1 further shows a first pixel 702 with a first pattern indicating a blue filter; a second pixel 704 with a second pattern indicating a green filter; a third pixel 706 with the second pattern indicating the green filter; and a fourth pixel 708 with a third pattern indicating a red filter.

Case 2 shows a 2×2 array of pixels, the first and second rows of pixels each include a pixel 712, 714 aligned with a microlens and a pixel 710, 716 aligned with a sub-microlens. The same patterns corresponding to red, green, and blue color filters of a Bayer filter used in Case 1 are used in Case 2. For example, pixel 710 has the first pattern, indicating a blue filter; pixels 712, 714 have the second pattern, indicating a green filter; and pixel 716 has the third pattern, indicating a red filter. Case 3 includes pixels aligned with either a micro or sub-microlens. Case 3 has the micro and sub-microlenses switching Bayer filter colors, from what is seen in Case 2. For example, the pixels have the same patterns as in Case 2; however, pixel 718 is now aligned with a microlens; pixels 720, 722 are aligned with a sub-microlens; and pixel 726 is aligned with a microlens.

Figure 8:
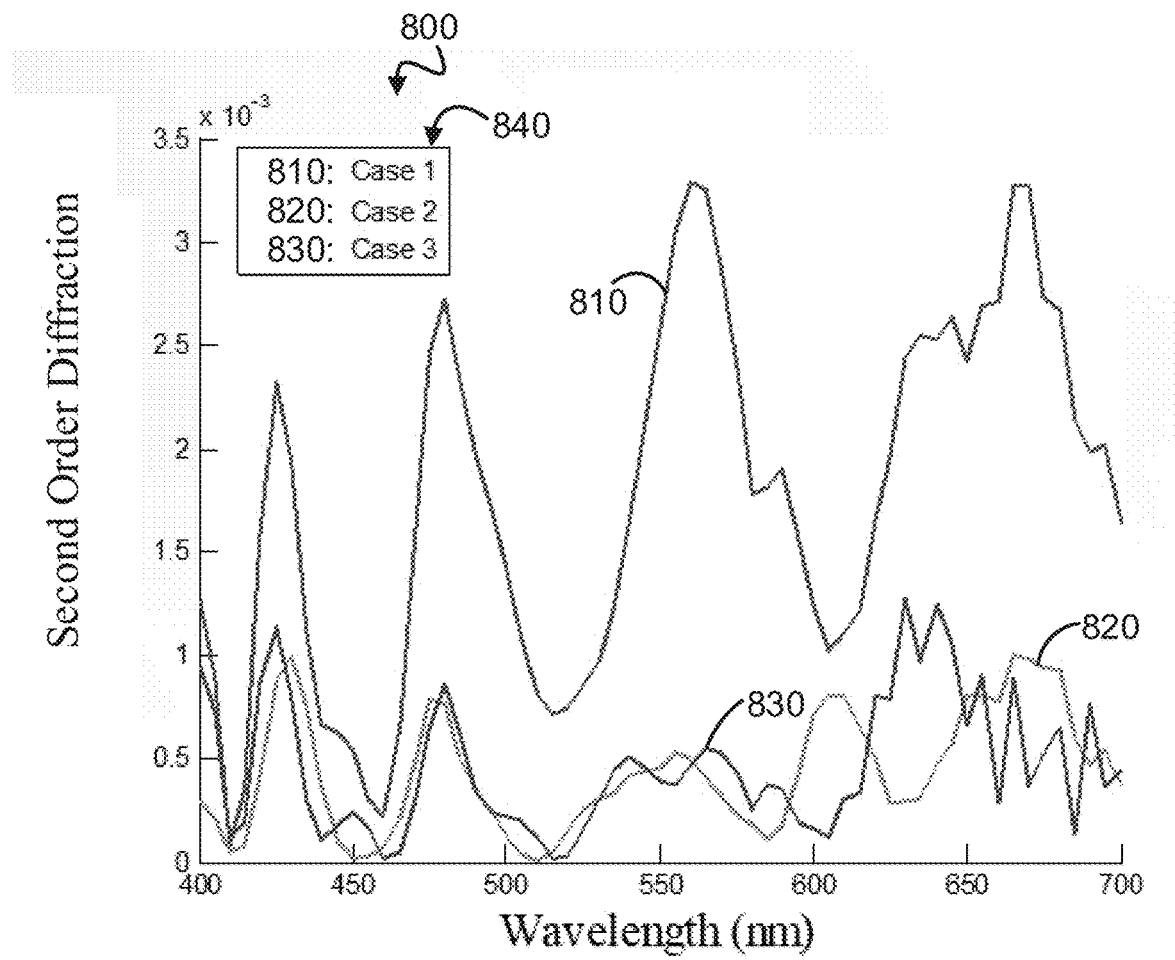
FIG. 8 is a graph showing second-order diffraction for varying wavelengths for three different case studies, according to embodiments.

FIG. 8 shows a graph 800 of second order diffraction of light at wavelengths ranging from 400 nm to 700 nm, including diffraction measurements 810, 820, 830, corresponding to Case 1, Case 2, and Case 3, respectively, as shown within legend 840. Diffraction measurements 820 and 830 show a significant reduction of second order diffraction of light at all wavelengths, except for the 410 nm region, in comparison to diffraction measurement 810. Further, diffraction measurements 820 and 830 stay roughly consistent until around the 590 nm region and then diverge. The difference between diffraction measurements 820 and 830 may be due to the color of the Bayer filter that a micro or sub-microlens covers. In some embodiments, color filter arrays other than a Bayer filter may be used, such as an RGBE filter, RYYB filter, CYYM filter, CYGM filter, RGBW filter, X-Trans filter, Quad Bayer filter, RYYB Quad filter, Nonacell filter, RCCC filter, RCCB filter, etc. In some embodiments, each filter of the color filter array may include one or more of a red filter, a green filter, a blue filter, a cyan filter, a magenta filter, a yellow filter, and a panchromatic filter. In some embodiments, the image sensor includes a color filter array (CFA) between the sub-microlens array and the semiconductor substrate and the CFA includes a plurality of color filters arranged in a Bayer pattern.

The above description presents the best mode contemplated for carrying out the present embodiments, and of the manner and process of practicing them, in such full, clear, concise, and exact terms as to enable any person skilled in the art to which they pertain to practice these embodiments. The present embodiments are, however, susceptible to modifications and alternate constructions from those discussed above that are fully equivalent. Consequently, the present invention is not limited to the particular embodiments disclosed. On the contrary, the present invention covers all modifications and alternate constructions coming within the spirit and scope of the present disclosure. For example, the arrangements/sequences of pixels or the array of microlenses described herein need not be formed in the same structure as they have been presented, and may be formed in any way. Further, structures that have been presented as being formed separately may in alternative embodiments be formed concurrently. Likewise, structures that have been presented as being formed concurrently may in alternative embodiments be formed separately.

Combination of Features

The following embodiments are specifically contemplated, as well as any combinations of such embodiments that are compatible with other another:

(A) A flare-suppressing image sensor includes a plurality of pixels including a first set of pixels and a second set of pixels. The flare-suppressing image sensor further includes a plurality of microlenses each aligned to a respective one of the first set of pixels. The flare-suppressing image sensor also includes a plurality of sub-microlens arrays each aligned to a respective one of the second set of pixels.

(B) In the embodiment denoted by (A), the first set of pixels and the second set of pixels are arranged periodically such that every X pixel(s) from the first set of pixels is subsequently followed by Y pixel(s) from the second set of pixels, where X and Y are positive integers.

(C) In the embodiment denoted by (B), X is greater than Y.

(D) In the embodiment denoted by (B), X is equal to 1 and Y is equal to two.

(E) In the embodiment denoted by (A), each sub-microlens has a width that is between a half micrometer and three micrometers.

(F) In the embodiment denoted by (A), each microlens has a width that is between five micrometers and a millimeter.

(G) In the embodiment denoted by (A), a width of each microlens being approximately twice that of a width of each sub-microlens.

(H) In the embodiment denoted by (A), a width of each microlens being approximately thrice that of a width of each sub-microlens.

(I) In the embodiment denoted by (A), the first set of pixels and the second set of pixels are arranged periodically to sufficiently reduce petal flare buildup.

(J) In the embodiment denoted by (A), each sub-microlens array is arranged in an M-by-N array, where M and N are numerical values greater than 1.

(K) In the embodiments denoted by (A) and (J), M is equal to N.

(L) In the embodiments denoted by (A) and (J), M is unequal to N.

(M) In the embodiment denoted by (A), the plurality of pixels are within a semiconductor substrate. Each of the plurality of microlenses and each of the plurality of sub-microlens arrays are in a microlens plane above the semiconductor substrate. The image sensor includes a color filter array (CFA) between the microlens plane and the semiconductor substrate, the CFA including a plurality of color filters arranged in a Bayer pattern.

(N) In the embodiments denoted (A) and (M), each pixel of the first set of pixels has one of a red or a blue filter of the Bayer pattern and each pixel of the second set of pixels has a green filter of the Bayer pattern.

(O) In the embodiment denoted by (A), the plurality of pixels arc is within a semiconductor substrate. Each of the plurality of microlenses and each of the plurality of sub-microlens arrays are in a microlens plane above the semiconductor substrate. The image sensor includes a color filter array (CFA) between the microlens plane and the semiconductor substrate. Each filter of the CFA is one or more of a red filter, a green filter, a blue filter, a cyan filter, a magenta filter, a yellow filter, and a panchromatic filter.

(P) In the embodiment denoted by (A), the first set of pixels and the second set of pixels are arranged randomly.

What is claimed is:

1. A flare-suppressing image sensor, comprising:
a plurality of image-sensor pixels within a semiconductor substrate and including a first set of pixels and a second set of pixels;
a plurality of microlenses each (i) in a microlens plane above the semiconductor substrate, (ii) aligned to a respective one of the first set of pixels, and (iii) having a width that is between a half micrometer and three micrometers;
a plurality of sub-microlens arrays each (i) in the microlens plane, (ii) aligned to a respective pixel of the second set of pixels, and (iii) including multiple sub-microlenses each having a width that is less than a width of each of the plurality of microlenses; and
a color filter array (CFA) between the microlens plane and the semiconductor substrate, wherein each filter of the CFA is one of a red filter, a green filter, a blue filter, a cyan filter, a magenta filter, a yellow filter, and a panchromatic filter;
none of the plurality of microlenses being aligned to any of the second set of pixels,
none of the plurality of sub-microlens arrays being aligned to any of the first set of pixels.

2. The flare-suppressing image sensor of claim 1, wherein the first set of pixels and the second set of pixels are arranged periodically such that every X pixel(s) from the first set of pixels is subsequently followed by Y pixel(s) from the second set of pixels, where X and Y are positive integers.

3. The flare-suppressing image sensor of claim 2, wherein X is greater than Y.

4. The flare-suppressing image sensor of claim 2, wherein X is equal to 1 and Y is equal to two.

5. The flare-suppressing image sensor of claim 1, wherein each microlens has a width that is between five micrometers and a millimeter.

6. The flare-suppressing image sensor of claim 1, a width of each microlens being approximately twice that of a width of each sub-microlens.

7. The flare-suppressing image sensor of claim 1, a width of each microlens being approximately thrice that of a width of each sub-microlens.

8. The flare-suppressing image sensor of claim 1, wherein the first set of pixels and the second set of pixels are arranged periodically to sufficiently reduce petal flare buildup.

9. The flare-suppressing image sensor of claim 1, wherein each sub-microlens array is arranged in an M-by-N array, where M and N are numerical values greater than 1.

10. The flare-suppressing image sensor of claim 9, wherein M is equal to N.

11. The flare-suppressing image sensor of claim 9, wherein M is unequal to N.

12. The flare-suppressing image sensor of claim 1, wherein the plurality of image-sensor pixels is within a semiconductor substrate, wherein each of the plurality of microlenses and each of the plurality of sub-microlens arrays are in a microlens plane above the semiconductor substrate, wherein the image sensor includes a color filter array (CFA) between the microlens plane and the semiconductor substrate, the CFA including a plurality of color filters arranged in a Bayer pattern.

13. The flare-suppressing image sensor of claim 12, wherein each pixel of the first set of pixels has one of a red or a blue filter of the Bayer pattern and wherein each pixel of the second set of pixels has a green filter of the Bayer pattern.

14. The flare-suppressing image sensor of claim 1, wherein the first set of pixels and the second set of pixels are arranged randomly.

15. The flare-suppressing image sensor of claim 1, further comprising:

a pixel array that includes each of the plurality of image-sensor pixels, the plurality of microlenses including a first microlens aligned to a first pixel of the first set of pixels;

the plurality of sub-microlens arrays including a first sub-microlens array that is (i) aligned to a second pixel, of the second set of pixels, that is adjacent to the first pixel, and (ii) coplanar with the first microlens in a plane parallel to the pixel array.

16. A flare-suppressing image sensor, comprising:

a semiconductor substrate having a pixel array that includes a first set of image-sensor pixels and a second set of image-sensor pixels;

a plurality of microlenses each (i) in a microlens plane above the semiconductor substrate, (ii) aligned to a respective one of the first set of image-sensor pixels, and (ii) having a width that is between a half micrometer and three micrometers;

a plurality of sub-microlens arrays each (i) in the microlens plane, (ii) aligned to a respective pixel of the second set of image-sensor pixels, and (iii) including multiple sub-microlenses each having a width that is less than a width of each of the plurality of microlenses; and the plurality of microlenses including a first microlens aligned to a first pixel of the first set of image-sensor pixels, a color filter array (CFA) between the microlens plane and the semiconductor substrate, wherein each filter of the CFA is one of a red filter, a green filter, a blue filter, a cyan filter, a magenta filter, a yellow filter, and a panchromatic filter;

the plurality of sub-microlens arrays including a first sub-microlens array that is (i) aligned to a second pixel, of the second set of image-sensor pixels, that is adjacent to the first pixel, and (ii) coplanar with the first microlens in a plane parallel to the pixel array.

* * * * *